US012685105B2

(12) United States Patent
Shen et al.

(10) Patent No.: US 12,685,105 B2
(45) Date of Patent: Jul. 14, 2026

(54) FORMING METHOD OF INTERCONNECT STRUCTURE

(71) Applicant: HON HAI PRECISION INDUSTRY CO., LTD., New Taipei City (TW)

(72) Inventors: Yun-Hung Shen, Hsinchu City (TW); Chien-Jung Yang, Hsinchu City (TW)

(73) Assignee: HON HAI PRECISION INDUSTRY CO., LTD., New Taipei City (TW)

( * ) Notice: Subject to any disclaimer, the term of this patent is extended or adjusted under 35 U.S.C. 154(b) by 412 days.

(21) Appl. No.: 18/403,751

(22) Filed: Jan. 4, 2024

(65) Prior Publication Data

US 2025/0105058 A1    Mar. 27, 2025

(30) Foreign Application Priority Data

Sep. 27, 2023    (TW) ................................. 112137129

(51) Int. Cl.
 *H10W 20/43*        (2026.01)
 *H10W 20/00*        (2026.01)
(52) U.S. Cl.
 CPC ....... *H10W 20/041* (2026.01); *H10W 20/056* (2026.01); *H10W 20/062* (2026.01); *H10W 20/081* (2026.01); *H10W 20/43* (2026.01)
(58) Field of Classification Search
 CPC ............. H10W 20/041; H10W 20/056; H10W 20/062; H10W 20/081; H10W 20/43; H10W 20/087; H10W 20/089
 USPC ....................................................... 257/758
 See application file for complete search history.

(56) References Cited

U.S. PATENT DOCUMENTS

| | | | |
|---|---|---|---|
| 7,253,524 B2 | 8/2007 | Wu et al. | |
| 12,538,775 B2 * | 1/2026 | Lee ......................... | H10P 30/40 |
| 2002/0123219 A1 * | 9/2002 | Laverty .............. | H10W 20/034 |
| | | | 438/638 |
| 2006/0027924 A1 | 2/2006 | Chen et al. | |
| 2006/0246718 A1 | 11/2006 | Frohberg et al. | |
| 2014/0227872 A1 * | 8/2014 | Zhang ................. | H10W 20/084 |
| | | | 438/667 |
| 2019/0096751 A1 | 3/2019 | Sato et al. | |
| 2023/0028904 A1 | 1/2023 | Chang et al. | |
| 2023/0253321 A1 | 8/2023 | Huang et al. | |

FOREIGN PATENT DOCUMENTS

| | | |
|---|---|---|
| TW | 396578 B | 7/2000 |
| TW | I625802 B | 6/2018 |

* cited by examiner

*Primary Examiner* — Monica D Harrison
(74) *Attorney, Agent, or Firm* — CKC & Partners Co., LLC

(57)        ABSTRACT

The present disclosure provides a forming method of an interconnect structure. The method includes forming a multilayer stack on a substrate including a wiring layer, where the multilayer stack includes an extreme low-k dielectric layer above the wiring layer and a mask layer above the extreme low-k dielectric layer. The method also includes etching the multilayer stack to form a trench exposing the extreme low-k dielectric layer, forming a spacer on a sidewall of the trench to apply a tensile stress to the mask layer, etching the extreme low-k dielectric layer to form a via hole exposing the wiring layer, filling the trench and the via hole with a conductive material, and performing a planarization process on the multilayer stack to remove the spacer.

20 Claims, 7 Drawing Sheets

1

FORMING METHOD OF INTERCONNECT STRUCTURE

CROSS-REFERENCE TO RELATED APPLICATION

This application claims priority to Taiwan Application Serial Number 112137129, filed Sep. 27, 2023 which is herein incorporated by reference in its entirety.

BACKGROUND

Field of Invention

The present disclosure relates to the forming method of the interconnect structure. More particularly, the present disclosure relates to the interconnect structure forming method by using the damascene process.

Description of Related Art

The damascene process can be applied to form the interconnect structure in devices, where the damascene process usually includes forming a gap in the dielectric layer and filling the gap with the metal material to form the conductive path of the interconnect structure. Since the operations of the damascene process are simpler than other methods, the damascene process may produce the interconnect structure with high yield. However, defects, such as deformation, may appear in the interconnect structure during the damascene process as the feature dimension of the device reduces, leading to the electrical failure of the interconnect structure.

SUMMARY

According to some embodiments of the present disclosure, a forming method of an interconnect structure includes the following steps. A multilayer stack is formed on a substrate including a wiring layer, where the multilayer stack includes an extreme low-k dielectric layer above the wiring layer and a mask layer above the extreme low-k dielectric layer above. The multilayer stack is etched to form a trench exposing the extreme low-k dielectric layer. A spacer is formed on a sidewall of the trench, where the spacer physically contacts the mask layer. The extreme low-k dielectric layer is etched to form a via hole exposing the wiring layer. The trench and the via hole are filled with a conductive material. A planarization process is performed on the multilayer stack to remove the spacer.

According to some embodiments of the present disclosure, a forming method of an interconnect structure includes the following step. An extreme low-k dielectric layer is formed above a substrate including a wiring layer. A first deposition process is performed to form a first titanium nitride layer above the extreme low-k dielectric layer. A first etching process is performed to form a first trench in the first titanium nitride layer and the extreme low-k dielectric layer. A second deposition process is performed to form a second titanium nitride layer on a sidewall of the first trench. A second etching process is performed to form a via hole in the extreme low-k dielectric layer, where the via hole exposes the wiring layer. The first trench and the via hole are filled with a conductive material. The first titanium nitride layer and the second titanium nitride layer are removed.

According to the above-mentioned embodiments of the present disclosure, the forming method of the interconnect structure includes forming the spacer in the trench of the multilayer stack, in which the spacer physically contacts the mask layer of the multilayer stack. Since the spacer can anchor the mask layer to maintain the structure and the position of the mask layer, the risk of deforming the trench shape by the spacer may be reduced, thereby improving the reliability of the interconnect structure formed from the trench.

DETAILED DESCRIPTION

The following disclosure provides many different embodiments, or examples, for implementing different features of the provided subject matter. Specific examples of components, arrangements, etc., are described below to simplify the present disclosure. These are, of course, merely examples and are not intended to be limiting.

Further, spatially relative terms, such as "beneath," "below," "lower," "above," "upper" and the like, may be used herein for ease of description to describe one element or feature's relationship to another element(s) or feature(s) as illustrated in the figures.

The present disclosure provides the forming method of the interconnect structure, where the method includes forming a trench in the multilayer stack of the interconnect structure and forming a spacer in the trench to contact a mask layer of the multilayer stack. During the forming process of the interconnect structure, the spacer may maintain the structure and the position of the mask layer. This reduces the risk of deforming the trench by the mask layer, thereby improving the reliability of the interconnect structure.

Figure 1:
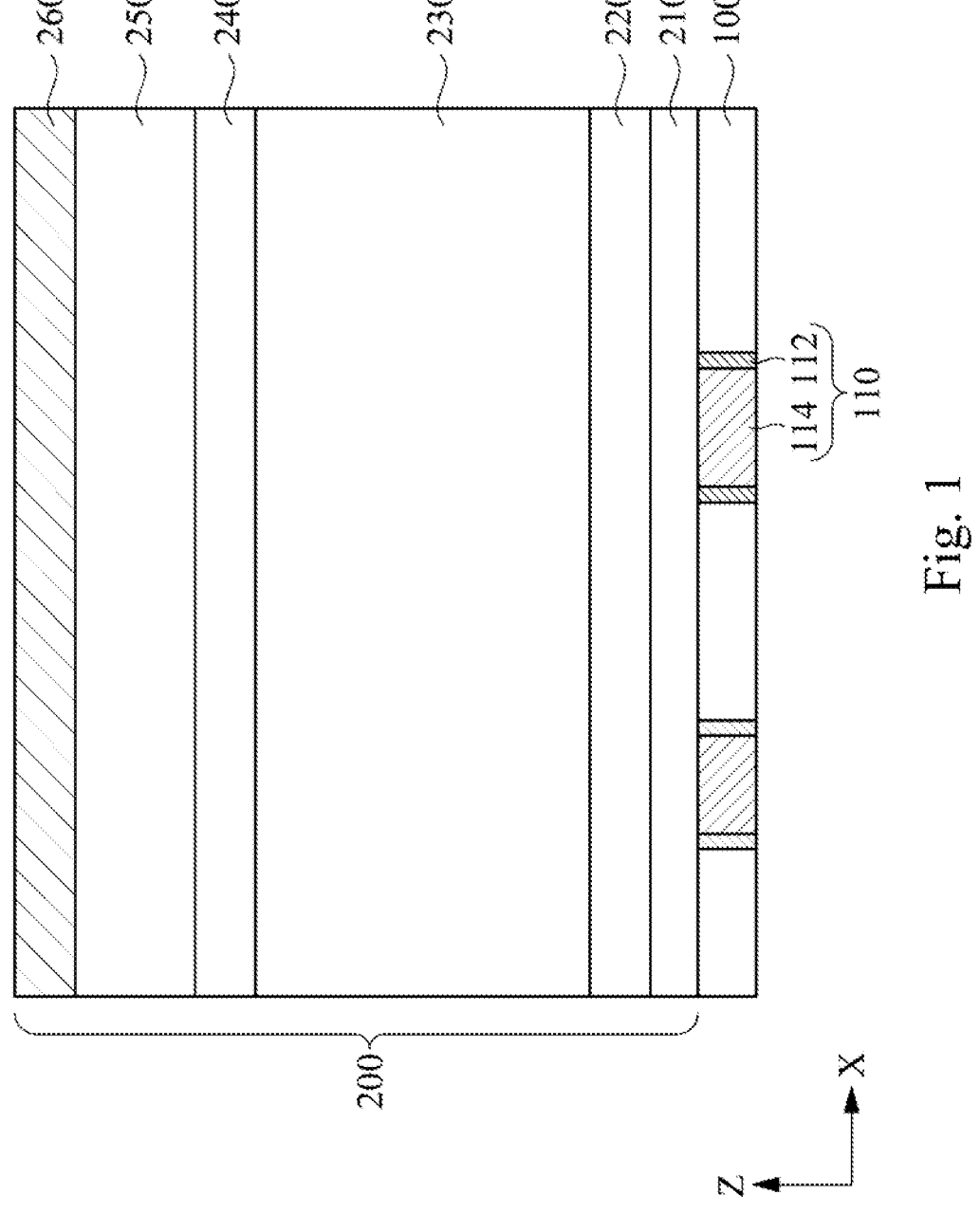
FIG. 1 to FIG. 7 illustrate cross-sectional views of various fabrication stages of an interconnect structure according to some embodiments of the present disclosure.

Referring to FIG. 1, a multilayer stack 200 is formed on a substrate 100. Specifically, the multilayer stack 200 includes a number of horizontally-stacked material layers that are formed on a top surface of the substrate 100, where these material layers will later be used to form the interconnect structure on the substrate 100. In some embodiments, the substrate 100 may include a wiring layer 110, while the multilayer stack 200 is formed on the substrate 100 and covers the wiring layer 110. The wiring layer 110 may include a barrier layer 112 and a conductive material 114, in which the barrier layer 112 surrounds the conductive material 114 to separate the conductive material 114 from the substrate 100. In such embodiments, the substrate 100 and the wiring layer 110 may be referred as a lower interconnect structure formed first, while the multilayer stack 200 will be used to form an upper interconnect structure opposite to the substrate 100.

The multilayer stack 200 may include an etch stop layer 210, an adhesion layer 220, an extreme low-k (ELK) dielectric layer 230, an adhesion layer 240, a dielectric layer 250, and a mask layer 260 sequentially stacked from the top surface of the substrate 100. In the multilayer stack 200, the extreme low-k dielectric layer 230 may act as an interlayer dielectric (ILD) in the following formation of the interconnect structure. Since the extreme low-k dielectric layer 230 with low dielectric constant can reduce the parasitic capacitance in the structure, the later formed interconnect structure may show improved electrical performance, for example, the reduced resistive-capacitive delay (RC delay) of the interconnect structure. In some embodiments, the extreme low-k dielectric layer 230 may include the extreme low-k dielectric material with a dielectric constant lower than about 2.5. For example, the extreme low-k dielectric layer 230 may be formed of organic silicon oxygen material (SiOCH), porous silicon material, the like, or a combination thereof. In the embodiments which the substrate 100 is referred as the lower interconnect structure, the material of the substrate 100 may be the same as that of the extreme low-k dielectric layer 230.

The mask layer 260 is formed above the extreme low-k dielectric layer 230 by suitable deposition process, such as chemical vapor deposition (CVD), spin-coating, or the like. A surface area of the mask layer 260 is no smaller than that of the extreme low-k dielectric layer 230, so that a vertical projection of the mask layer 260 in the Z-axis direction may cover the extreme low-k dielectric layer 230. In the following process, the pattern of the mask layer 260 may be transferred to the extreme low-k dielectric layer 230 to define the pattern of the interconnect structure in the extreme low-k dielectric layer 230. In some embodiments, the mask layer 260 may include the material different from that of the extreme low-k dielectric layer 230. For example, the mask layer 260 may be formed of titanium nitride (TiN). In some embodiments, the mask layer 260 may be the topmost layer of the multilayer stack 200, so that the mask layer 260 is exposed.

In some embodiments, the etch stop layer 210 may be between the extreme low-k dielectric layer 230 and the substrate 100, so that the etch stop layer 210 may protect the underlying substrate 100 during the formation of the pattern of the interconnect structure of extreme low-k dielectric layer 230. For example, the etch stop layer 210 may be formed of silicon carbide (SiC) or the like. In some embodiments, the etch stop layer 210 may act as a barrier layer which inhibits the diffusion of the conductive material (for example, the conductive material 404 shown in FIG. 6) along the X-axis direction in the later formed interconnect structure, thereby reducing the risk of unexpected conductive paths.

In some embodiments, the dielectric layer 250 may be between the extreme low-k dielectric layer 230 and the mask layer 260. The dielectric layer 250 may be used to improve the accuracy of the pattern of the interconnect structure in the extreme low-k dielectric layer 230. Specifically, a hardness of the dielectric layer 250 may be higher than that of the extreme low-k dielectric layer 230 to reduce the risk of over-etching the extreme low-k dielectric layer 230 in the pattern transferring process from the mask layer 260 to the extreme low-k dielectric layer 230, which maintains the pattern of the interconnect structure. For example, the dielectric layer 250 may be formed of plasma enhanced oxide (PEOX) or the like.

In some embodiments, multiple adhesion layers 220 and 240 may be positioned between and sandwiched by different material layers of the multilayer stack 200 to improve the structure stability of the multilayer stack 200. For example, the adhesion layer 220 and the adhesion layer 240 may be formed of tetraethoxysilane (TEOS) or the like. In the illustrated embodiment, the adhesion layer 220 may be between the extreme low-k dielectric layer 230 and the etch stop layer 210, while the adhesion layer 240 may be between the extreme low-k dielectric layer 230 and the dielectric layer 250.

Figure 2:
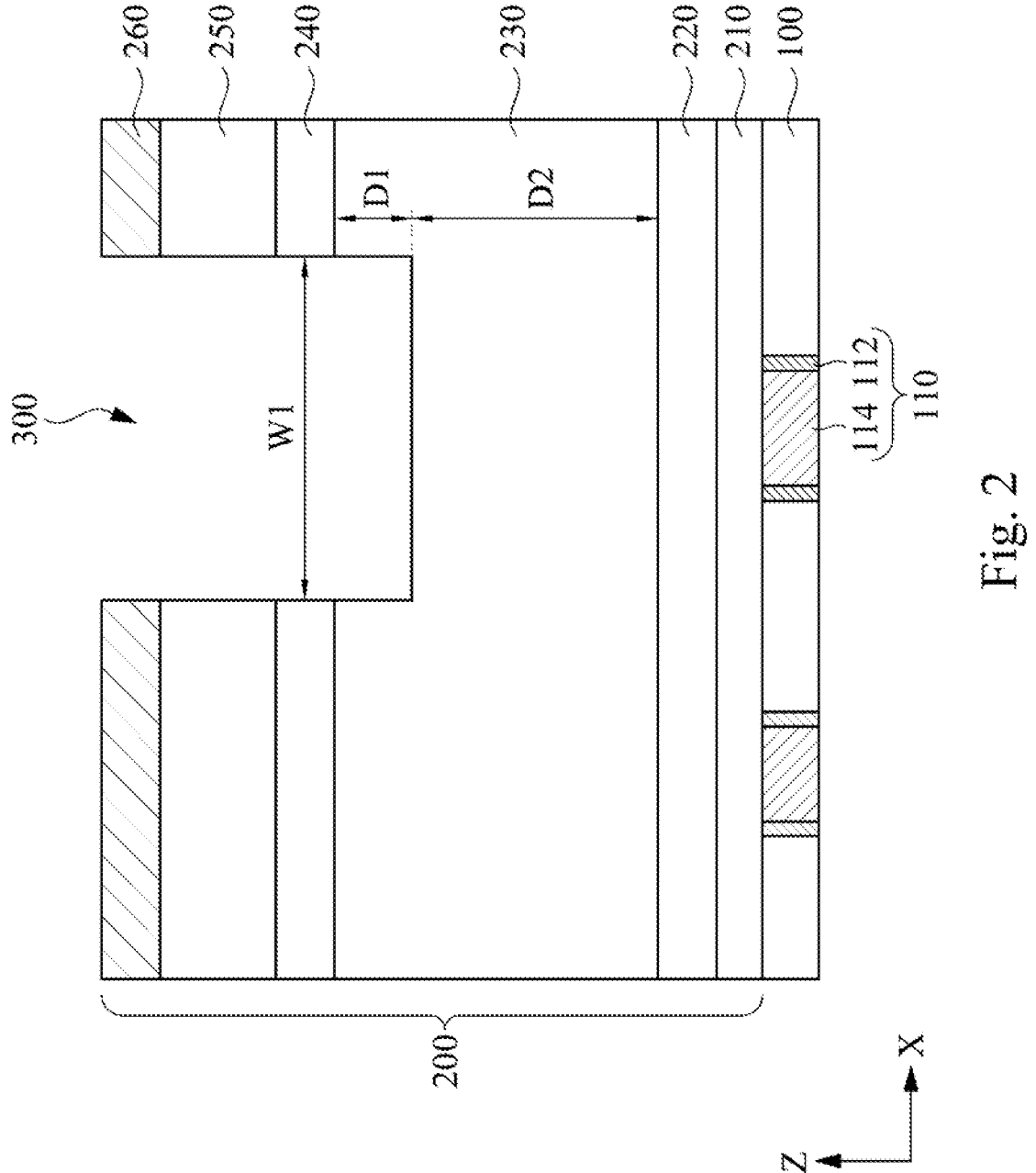

Referring to FIG. 2, the multilayer stack 200 is etched to form a first trench 300. Specifically, a photoresist layer (not shown) may be first formed on the top surface of the multilayer stack 200, and the photoresist layer may be patterned to form an opening exposing the multilayer stack 200. An etching process is then performed on the top surface of the multilayer stack 200 through the opening of the photoresist layer to etch the mask layer 260, the dielectric layer 250, the adhesion layer 240, and the extreme low-k dielectric layer 230, which forms the first trench 300 exposing the extreme low-k dielectric layer 230. In other words, the first trench 300 extends from the top surface of the mask layer 260 toward the substrate 100, while the bottom surface of the first trench 300 is between the top surface and the bottom surface of the extreme low-k dielectric layer 230. In the following process, the first trench 300 may be used to form the pattern of the interconnect structure in the extreme low-k dielectric layer 230.

In some embodiments, there may be a first distance D1 between the bottom surface of the first trench 300 and the top surface of the extreme low-k dielectric layer 230, and a second distance D2 between the bottom surface of the first trench 300 and the bottom surface of the extreme low-k dielectric layer 230. The first distance D1 may be smaller than the second distance D2, leading to a sufficient thickness of the extreme low-k dielectric layer 230 below the first trench 300 for the later-formed interconnect structure in the extreme low-k dielectric layer 230.

In some embodiments, the etching process may be an anisotropic etching process, such as a dry etching process by using plasma, to form the levelled sidewalls of the mask layer 260, the dielectric layer 250, the adhesion layer 240, and the extreme low-k dielectric layer 230 in the first trench 300, while the first trench 300 has a uniform width W1 in the X-axis direction. In some embodiments, the photoresist layer on the multilayer stack 200 may be stripped after forming the first trench 300 to re-expose the mask layer 260.

Figure 3:
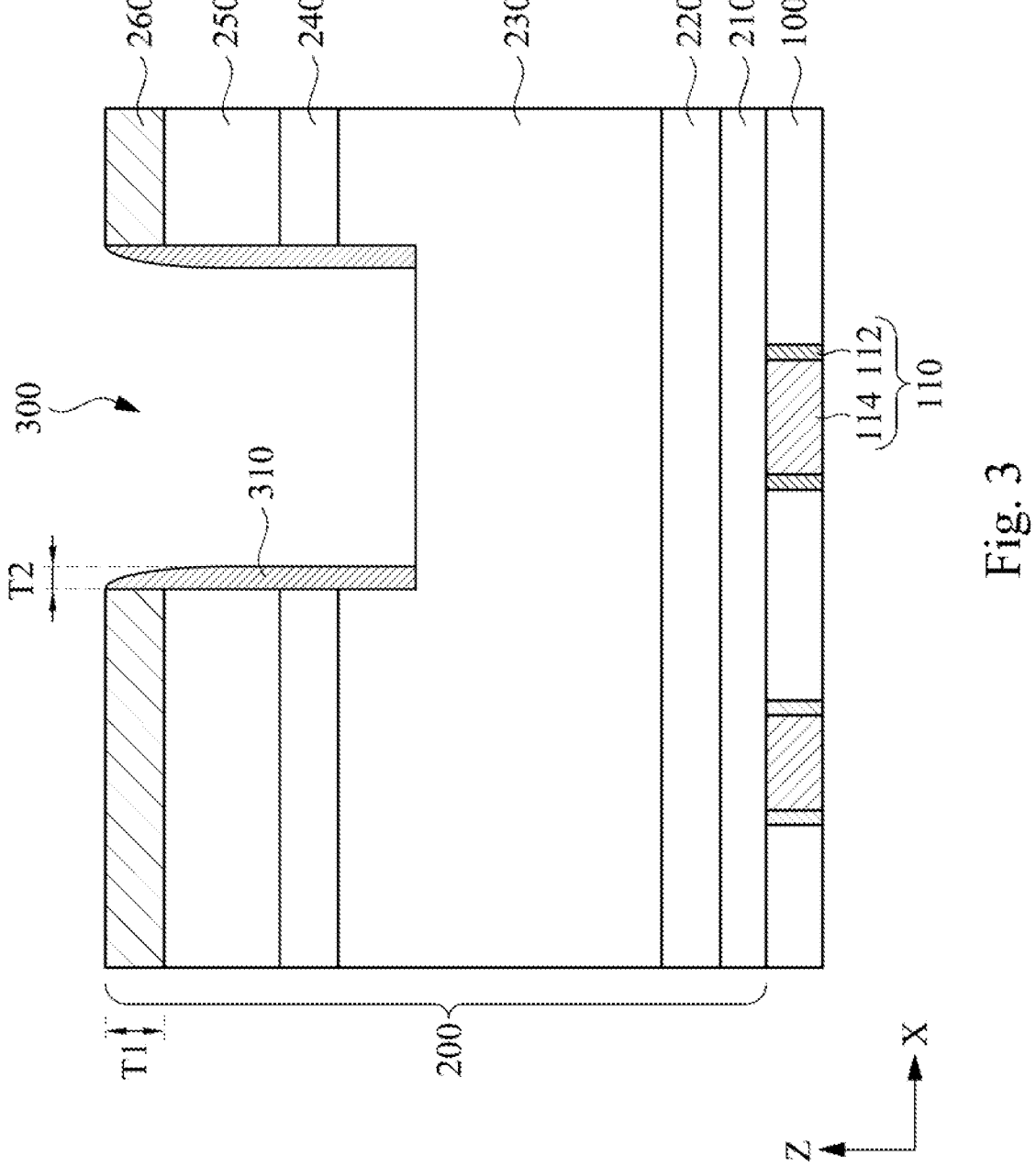

Referring to FIG. 3, spacers 310 are formed on sidewalls of the first trench 300. Specifically, a deposition process is performed in the first trench 300 to deposit the material of the spacers 310 along the sidewalls of the first trench 300, thereby forming the spacers 310 extending from the top surface of the mask layer 260 toward the substrate 100. The spacers 310 may physically contact the entire sidewall of the mask layer 260 alone, physically contact the mask layer 260 and the dielectric layer 250, or physically contact the mask layer 260, the dielectric layer 250, and the adhesion layer 240. The spacers 310 may also extend from the mask layer 260 to a position lower than the top surface of the extreme low-k dielectric layer 230, so that the spacers 310 physically contact the extreme low-k dielectric layer 230 but are distanced from the bottom surface of the first trench 300. The spacers 310 may have straight sidewalls vertical to the bottom surface of the first trench 300 or tapered sidewalls shown in FIG. 3.

In some embodiments, after forming the spacers 310 on the sidewalls of the first trench 300, the spacers 310 may apply a tensile stress to the mask layer 260 to improve the stability of the pattern of the mask layer 260. For example, when the first trench 300 is further etched into the extreme low-k dielectric layer 230 in the following process, the spacers 310 with the tensile stress may maintain the structure and the position of the mask layer 260, so that the mask layer 260 is anchored by the spacers 310. Therefore, the spacers 310 may reduce the impact of the mask layer 260 on the shape of the first trench 300, which provides the well stability of the later formed interconnect structure. If the spacers 310 are absent from the first trench 300, the mask layer 260 may deform during the etching process, leading to the pattern wiggling of the first trench 300 and the failure of the interconnect structure. In some embodiments, the tensile stress of the spacers 310 may be larger than or equal to 1 gigapascal (GPa), so that the tensile stress of the spacers 310 is high enough to reduce the deformation of the mask layer 260 during the following etching process. For example, the tensile stress of the spacers 310 may be between 1 GPa and 1.7 GPa.

In some embodiments, the mask layer 260 and the spacers 310 may have an appropriate thickness ratio, so that the tensile stress of the spacers 310 is high enough to significantly reduce the deformation of the mask layer 260. The mask layer 260 may have a thickness T1 in the Z-axis direction vertical to the top surface of the extreme low-k dielectric layer 230, while one of the spacers 310 may have a thickness T2 smaller than thickness T1 in the X-axis direction parallel to the top surface of the extreme low-k dielectric layer 230. As a ratio of the thickness T1 over the thickness T2 is appropriate, the spacers 310 may not significantly affect the shape of the first trench 300, and the tensile stress of the spacers 310 may reduce the deformation of the mask layer 260 and the impact on the following interconnect structure. For example, a ratio of the thickness T1 over the thickness T2 may be between 1.5 and 2.5. If the ratio of the thickness T1 over the thickness T2 is larger than 2.5, the tensile stress of the spacers 310 may be too low to significantly reduce the deformation of the mask layer 260 by the first trench 300.

In some embodiments, the spacers 310 may include the same or similar material as the mask layer 260, which provides the high adhesion between the spacers 310 and the mask layer 260. For example, when the mask layer 260 includes titanium nitride, the spacers 310 may be formed of titanium nitride, silicon nitride (SiN), silicon carbon nitride (SiCN), nitride, carbon nitride, the like, or a combination thereof. In some embodiments, the spacers 310 and the mask layer 260 may include different materials, so that the spacers 310 and the mask layer 260 apply different types of stress. For example, when the mask layer 260 includes a nitride material that leads to the compression stress of the mask layer 260, the spacers 310 may include a nitride material or a carbon nitride material different from the material of the mask layer 260 to provide the tensile stress of the spacers 310.

In some other embodiments, the spacers 310 and the mask layer 260 include the same material, but the spacers 310 and the mask layer 260 may be formed by the deposition processes with different operations or processing parameters, so that the spacers 310 and the mask layer 260 have different types of stress. For example, the mask layer 260 may be a titanium nitride layer formed by a first deposition process, and the spacers 310 may be a titanium nitride layer formed by a second deposition process. Even if the deposition processes of the spacers 310 and the mask layer 260 are performed by using the same material (i.e., titanium nitride), but the applied bias during the first deposition process may be different from that of the second deposition process, or the gas pressure used in the second deposition process may be larger than that of the first deposition process. As a result, the spacers 310 have a tensile stress while the mask layer 260 has a compression stress. For another example, the mask layer 260 and the spacers 310 may be the same nitride material, but the spacers 310 have upwardly growing horizontal layers as its main growing direction, while the mask layer 260 has a laterally growing vertical column as its main growing direction. Since the growing direction of the spacers 310 is different from that of the mask layer 260, the spacers 310 may have a tensile stress while the mask layer 260 may have a compression stress, even if the deposition processes of the spacer 310 and the mask layer 260 are performed by using the same nitride material.

In addition to the tensile stress of the spacers 310 for reducing the impact of the mask layer 260 on the interconnect structure, the adhesion between the spacers 310 and other material layers in the multilayer stack 200 may also reduce the risk of pattern wiggling. For example, in the embodiments which the dielectric layer 250 includes plasma enhanced oxide and the adhesion layer 240 includes TEOS, the spacers 310 may include a nitride material to provide the high adhesion between the spacers 310 and the dielectric layer 250 or the adhesion layer 240. As the spacers 310 extend from the mask layer 260 toward the substrate 100, the spacers 310 may physically contact the dielectric layer 250 and the adhesion layer 240 to maintain the position of the sidewalls of the mask layer 260 to be levelled with the sidewalls of the dielectric layer 250 and the adhesion layer 240, so that the mask layer 260 is anchored by the spacers 31.

Figure 4:
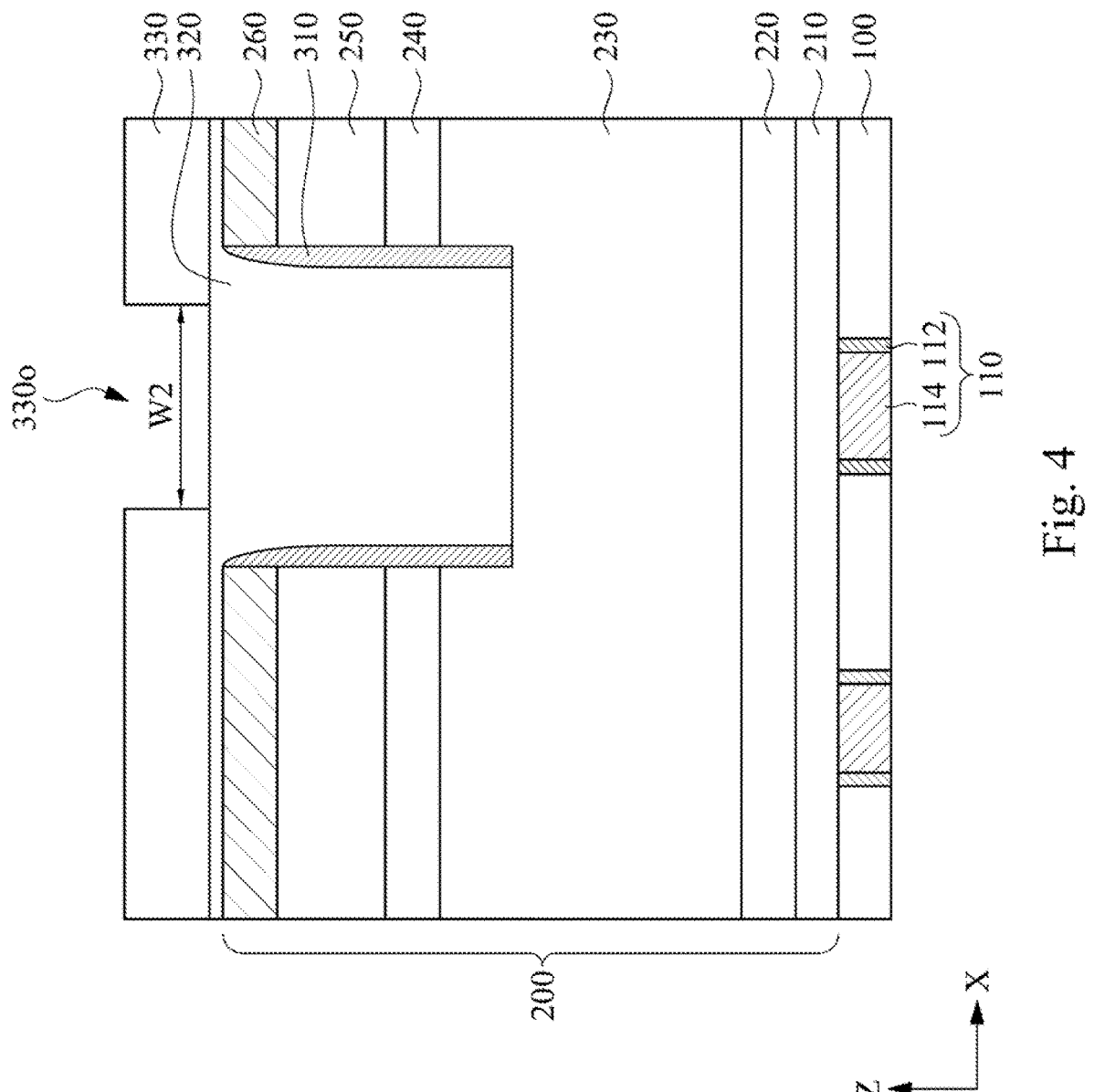

Referring to FIG. 4, an antireflective coating 320 is formed in the first trench 300, and a photoresist layer 330 exposing the antireflective coating 320 is formed on the antireflective coating 320. Specifically, the antireflective coating 320 is filled in the first trench 300 to cover the spacers 310. The top surface of the antireflective coating 320 may be higher than the top surface of the mask layer 260, so that antireflective coating 320 covers the top surface of the mask layer 260. The photoresist layer 330 is then formed on the top surface of the antireflective coating 320. A patterning process is performed on the photoresist layer 330 to form an opening 3300 in the photoresist layer 330, in which the opening 3300 exposes a portion of the top surface of the antireflective coating 320. The opening 3300 of the photoresist layer 330 may be used to define the pattern of the via, such as the via 410 shown in FIG. 7, of the interconnect structure. As a result, the opening 3300 may have a width W2 in the X-axis direction, where the width W2 is smaller than a distance (i.e., width W3 shown in FIG. 5) between the spacers 310 on the sidewalls of the first trench 300 in the X-axis direction.

Figure 5:
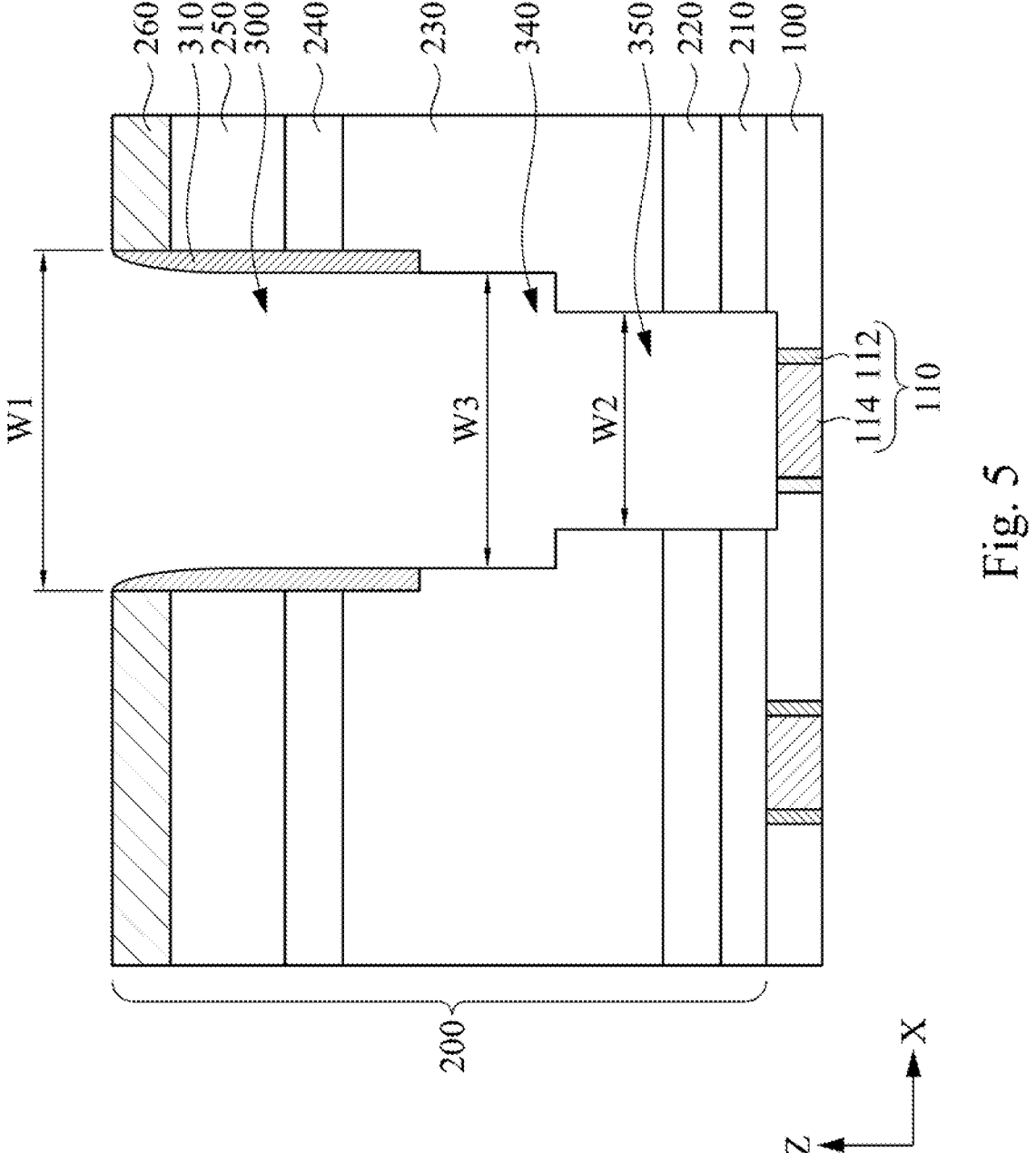

Referring to FIG. 5, the extreme low-k dielectric layer 230 is etched to form a second trench 340 and a via hole 350, in which the via hole 350 exposes the wiring layer 110 in the substrate 100. Specifically, the pattern of the opening 3300 is transferred to the extreme low-k dielectric layer 230 to form the via hole 350 by performing an etching process on the antireflective coating 320 and the multilayer stack 200 through the opening 3300. The via hole 350 may further extends through the adhesion layer 220 and the etch stop layer 210 below the extreme low-k dielectric layer 230 to expose the wiring layer 110 in the substrate 100. Since the pattern of the via hole 350 comes from the opening 3300, the via hole 350 may have the width W2 in the X-axis direction.

During the etching process for the via hole 350, the antireflective coating 320 and the extreme low-k dielectric layer 230 may also be etched along the sidewalls of the spacers 310 to form the first trench 300 re-exposing the spacers 310 and form the second trench 340 between the first trench 300 and the via hole 350. In other words, the spacers 310 in the first trench 300 may define the pattern of the second trench 340. Since the pattern of the second trench 340 comes from the spacers 310, the second trench 340 may have the width W3 same as the distance between the spacers 310 in the X-axis direction. The width W3 is smaller than the width W1 of the first trench 300 and larger than the width W2 of the via hole 350.

During the etching process of the second trench 340 and the via hole 350, the spacers 310 can anchor the mask layer 260 to maintain the shape of the first trench 300, thereby significantly reducing the risk of pattern wiggling of the first trench 300, the second trench 340, or the via hole 350. In addition, the high adhesion between the spacers 310 and the mask layer 260, the dielectric layer 250, the adhesion layer 240 or the extreme low-k dielectric layer 230 is also beneficial for anchoring the mask layer 260, which improves the structure stability of the first trench 300, the second trench 340, or the via hole 350. In the following process, the second trench 340 and the via hole 350 can be used to form the interconnect structure, while the high stability of the second trench 340 and the via hole 350 may improve the reliability of the later formed interconnect structure.

In some embodiments, the etching process may be an anisotropic etching process, such as the dry etch process by using plasma. The etching process may apply various processing parameters to form the second trench 340 and the via hole 350 during the etching process. For example, different gas etchants may be used to control the etching rates of the antireflective coating 320 and the extreme low-k dielectric layer 230, thereby simultaneously extending the via hole 350 and forming the second trench 340 above the via hole 350.

In some embodiments, the etching process may slightly etch the substrate 100 and the wiring layer 110, so that the bottom surface of the via hole 350 is lower than the top surface of the substrate 100 to ensure that the via hole 350 exposes the wiring layer 110. In some embodiments, the etching process may also remove the antireflective coating 320 and the photoresist layer 330 shown in FIG. 4.

Figure 6:
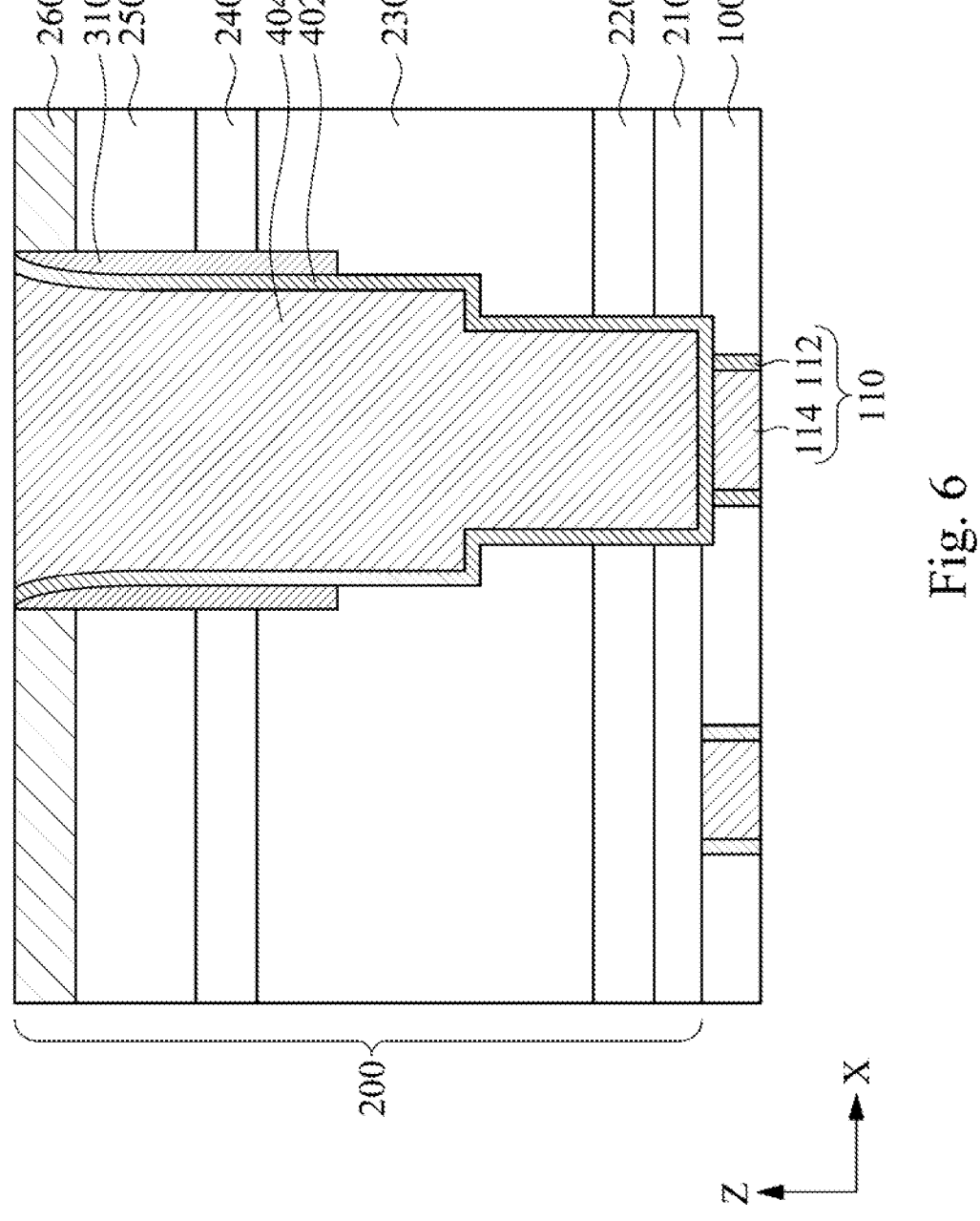

Referring to FIG. 6, the first trench 300, the second trench 340, and the via hole 350 are filled with a conductive material 404, where the conductive material 404 forms a conductive path in the Z-axis direction with the wiring layer 110 and cover the spacers 310. After the conductive material 404 is filled, the top surface of the conductive material 404 may be levelled with the top surface of the mask layer 260. In some other embodiments, the conductive material 404 may further extend above the mask layer 260 to cover the top surface of the mask layer 260.

In some embodiments, the conductive material 404 may be formed by sputtering, electroplating, other suitable deposition process, or a combination thereof. The conductive material 404 may include copper metal, copper alloy, the like, or a combination thereof. The conductive material 404 may include the same or similar material as the conductive material 114 to facilitate the impedance matching of the conductive material 114 and the conductive material 404. In some embodiments, the conductive material 404 may be a single material or a combination of multilayer materials.

In some embodiments, a barrier layer 402 may be deposited in the first trench 300, the second trench 340, and the via hole 350 before filling the conductive material 404, so that the barrier layer 402 covers the spacers 310, the sidewalls and bottom surface of the second trench 340, the sidewall and bottom surface of the via hole 350. The barrier layer 402 also physically separates the conductive material 404 from the multilayer stack 200 to prevent the conductive material 404 from diffusing into the multilayer stack 200. In some other embodiments, the barrier layer 402 may be absent between the conductive material 404 and the wiring layer 110, so that the conductive material 404 physically contacts the conductive material 114 of the wiring layer 110.

Figure 7:
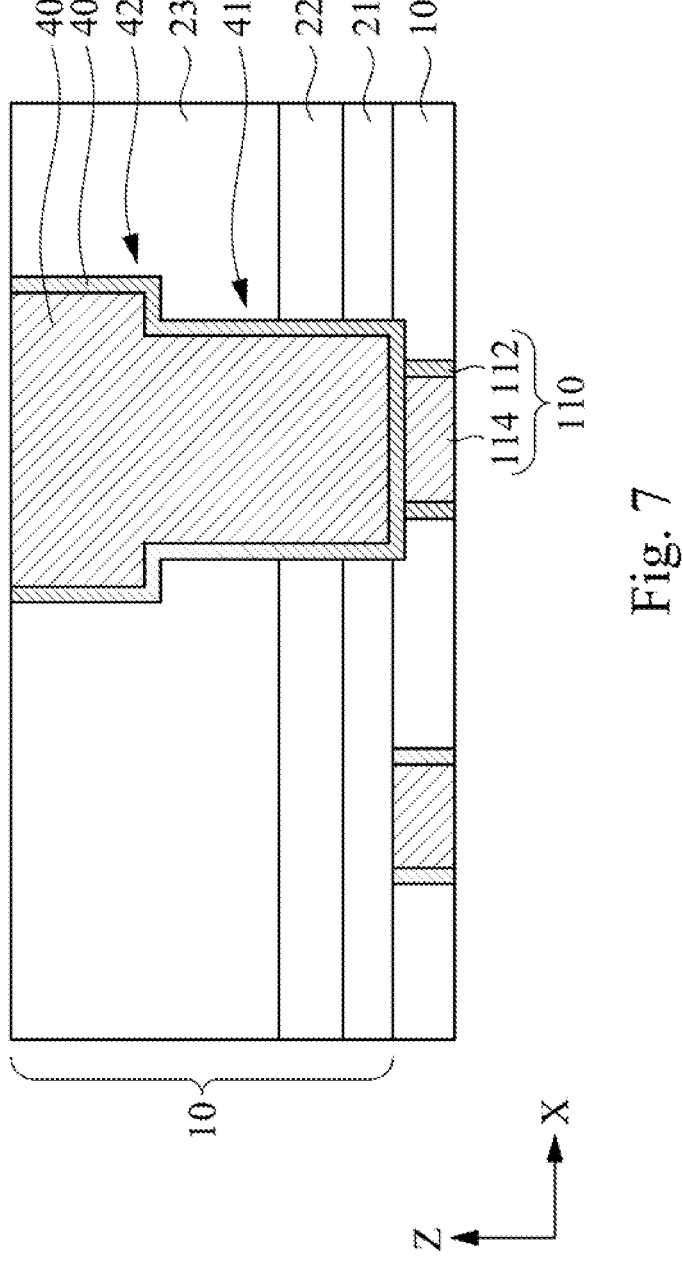

Referring to FIG. 7, the spacers 310 are removed to form the interconnect structure 10. Specifically, a planarization process is performed on the multilayer stack 200 shown in FIG. 6 to remove the material layers above the bottom surface of the spacer 310. These material layers include the mask layer 260, the dielectric layer 250, the adhesion layer 240, the spacers 310, a portion of the extreme low-k dielectric layer 230, the barrier layer 402 between the spacers 310, and the conductive material 404 between the spacers 310.

After the planarization process, the conductive material 404 filled in the via hole 350 forms the via 410 of the interconnect structure 10, and the conductive material 404 filled in the second trench 340 forms the wiring layer 420 of the interconnect structure 10. The wiring layer 420 is electrically connected to the wiring layer 110 in the substrate 100 by the via 410 to form the conductive path in the Z-axis direction. Since the planarization process removes the spacers 310, the spacer 310 may be absent between the wiring layer 420 and the extreme low-k dielectric layer 230, which prevents the spacer 310 from impacting the electrical performance of the interconnect structure 10.

In some embodiments, the planarization process may remove the extreme low-k dielectric layer 230, the barrier layer 402, and the conductive material 404 below the spacer 310, leading to a thickness of the wiring layer 420 in the Z-axis direction smaller than a depth of the second trench 340 shown in FIG. 5.

According to the above-mentioned embodiments of the present disclosure, the forming method of the interconnect structure includes forming the trench in the multilayer stack for the interconnect structure and forming the spacers on the sidewalls of the trench to contact the mask layer of the multilayer stack. Since the spacers apply a tensile stress or have a high adhesion with the multilayer stack, the spacers may anchor the mask layer to reduce the risk of the deformation of the trench. Therefore, the trench shape may be maintained during the interconnect structure process, leading to the high structure stability of the interconnect structure formed from the trench and the improved reliability of the interconnect structure. In addition, the forming method of the interconnect structure includes removing the spacer from the interconnect structure to prevent the spacer from impacting the electrical performance of the interconnect structure.

What is claimed is:

1. A method of forming an interconnect structure, comprising:

forming a multilayer stack on a substrate comprising a wiring layer, wherein the multilayer stack comprises:

an extreme low-k dielectric layer above the wiring layer; and a mask layer above the extreme low-k dielectric layer;

etching the multilayer stack to form a trench, wherein the trench exposes the extreme low-k dielectric layer;

forming a spacer on a sidewall of the trench, wherein the spacer physically contacts the mask layer;

etching the extreme low-k dielectric layer to form a via hole, wherein the via hole exposes the wiring layer;

filling the trench and the via hole with a conductive material; and performing a planarization process on the multilayer stack to remove the spacer.

2. The method of claim 1, wherein a tensile stress of the spacer is between 1 GPa and 1.7 GPa after forming the spacer on the sidewall of the trench.

3. The method of claim 1, wherein the spacer covers an entire sidewall of the mask layer in the trench after forming the spacer on the sidewall of the trench.

4. The method of claim 1, wherein the spacer physically contacts the extreme low-k dielectric layer after forming the spacer on the sidewall of the trench.

5. The method of claim 1, wherein the spacer extends from the mask layer to a bottom surface of the trench after forming the spacer on the sidewall of the trench.

6. The method of claim 1, wherein the mask layer has a first thickness in a first direction vertical to a top surface of the extreme low-k dielectric layer, the spacer has a second thickness in a second direction parallel to the top surface of the extreme low-k dielectric layer, and the first thickness is larger than the second thickness.

7. The method of claim 1, wherein the mask layer and the spacer comprises a same nitride material.

8. The method of claim 1, wherein the mask layer comprises a first nitride material, the spacer comprises a second nitride material or a carbon nitride material different from the first nitride material.

9. The method of claim 1, wherein the multilayer stack further comprises:

a dielectric layer between the extreme low-k dielectric layer and the mask layer, wherein a hardness of the dielectric layer is higher than that of the extreme low-k dielectric layer.

10. The method of claim 9, wherein the step of etching the multilayer stack to form the trench further comprises etching the dielectric layer, and wherein the spacer physically contacts the dielectric layer after forming the spacer on the sidewall of the trench.

11. The method of claim 1, wherein the multilayer stack further comprises:

an adhesion layer between the mask layer and the extreme low-k dielectric layer, wherein the step of etching the multilayer stack to form the trench comprises etching the adhesion layer, and wherein the spacer physically contacts the adhesion layer after forming the spacer on the sidewall of the trench.

12. The method of claim 1, wherein after etching the multilayer stack to form the trench, a first distance between a bottom surface of the trench and a top surface of the extreme low-k dielectric layer is smaller than a second distance between the bottom surface of the trench and a bottom surface of the extreme low-k dielectric layer.

13. A method of forming an interconnect structure, comprising:

forming an extreme low-k dielectric layer above a substrate comprising a wiring layer;

performing a first deposition process to form a first titanium nitride layer above the extreme low-k dielectric layer;

performing a first etching process to form a first trench in the first titanium nitride layer and the extreme low-k dielectric layer;

performing a second deposition process to form a second titanium nitride layer on a sidewall of the first trench;

performing a second etching process to form a via hole in the extreme low-k dielectric layer, wherein the via hole exposes the wiring layer;

filling the first trench and the via hole with a conductive material; and removing the first titanium nitride layer and the second titanium nitride layer.

14. The method of claim 13, wherein a first growing direction of the first deposition process is different from a second growing direction of the second deposition process.

15. The method of claim 13, wherein a first bias applied during the first deposition process is different from a second bias applied during the second deposition process.

16. The method of claim 13, wherein after performing the second deposition process, the first titanium nitride layer has a first thickness in a first direction vertical to a top surface of the extreme low-k dielectric layer, the second titanium nitride layer has a second thickness in a second direction parallel to the top surface of the extreme low-k dielectric layer, and a ratio of the first thickness over the second thickness is between 1.5 and 2.5.

17. The method of claim 13, wherein a tensile stress of the second titanium nitride layer is larger than or equal to 1 GPa after performing the second deposition process.

18. The method of claim 13, wherein a bottom surface of the second titanium nitride layer is lower than a bottom surface of the first titanium nitride layer after performing the second deposition process.

19. The method of claim 13, wherein the second titanium nitride layer extends from the first titanium nitride layer to a position lower than a top surface of the extreme low-k dielectric layer after performing the second deposition process.

20. The method of claim 13, wherein the step of performing the second etching process further comprises etching the extreme low-k dielectric layer along a sidewall of the second titanium nitride layer to form a second trench, and wherein the step of filling the first trench and the via hole with the conductive material comprises filling the second trench with the conductive material.

* * * * *